United States Patent [19]

Takinishi et al.

[11] Patent Number: 5,364,910
[45] Date of Patent: Nov. 15, 1994

[54] MATERIAL FOR FORMING COATING FILM

[75] Inventors: Fumitaka Takinishi, Yokohama; Makiko Togo, Fuchu; Masayuki Endo; Yasuaki Yokoyama, both of Yokohama, all of Japan

[73] Assignee: Japan Synthetic Rubber Co., Ltd., Tokyo, Japan

[21] Appl. No.: 998,657

[22] Filed: Dec. 29, 1992

Related U.S. Application Data

[63] Continuation of Ser. No. 717,655, Jun. 19, 1991, abandoned.

[30] Foreign Application Priority Data

Jun. 20, 1990 [JP]   Japan ................................ 2-162083

[51] Int. Cl.$^5$ .................. C08G 59/40; C08G 59/42; C08G 59/50; C08G 59/62
[52] U.S. Cl. ................ 525/327.3; 525/326.9; 525/329.4; 525/330.3; 525/330.5; 525/375; 525/382; 525/384; 525/386; 525/523; 525/525; 525/533
[58] Field of Search .............. 525/375, 382, 533

[56] References Cited

U.S. PATENT DOCUMENTS

| | | | |
|---|---|---|---|
| 3,058,947 | 10/1962 | Fryling | 525/132 |
| 3,880,946 | 4/1975 | Labana | 525/176 |
| 3,931,109 | 1/1976 | Martin | 525/507 |
| 4,091,048 | 5/1978 | Labana | 525/186 |
| 4,436,890 | 3/1984 | Kaufman | 528/93 |
| 4,439,560 | 3/1984 | Takashina | 523/437 |
| 4,703,101 | 10/1987 | Singer | 528/87 |

FOREIGN PATENT DOCUMENTS

| | | |
|---|---|---|
| 227940 | 12/1984 | Japan . |
| 60-217230 | 10/1985 | Japan . |
| 217230 | 10/1985 | Japan . |
| 127727 | 6/1986 | Japan . |
| 132925 | 6/1988 | Japan . |
| 63-132925 | 6/1988 | Japan . |

OTHER PUBLICATIONS

WPIL, File Supplier, Derwent Publications Ltd., London, GB; AN-85-034394 & JP-A-59227940 (Kansai Paint) *Abstract*.
WPIL, File Supplier, Derwent Publications Ltd., London, GB; AN-88-230273 & JP-A-63132925 (Sumitomo Chem) *Abstract*.
WPIL, File Supplier, Derwent Publications Ltd., London, GB; AN-86-194137 & JP-A-61127727 (Hitachi Cable) *Abstract*.

*Primary Examiner*—Fred Zitomer
*Attorney, Agent, or Firm*—Oblon, Spivak, McClelland, Maier & Neustadt

[57] ABSTRACT

A material for forming a coating film which comprises a compound having at least one glycidyl group in the molecule, a compound having a substituent capable of reacting with the glycidyl group, and a compound having a heterocyclic structure containing secondary nitrogen atom and/or tertiary nitrogen atom. The material is excellent in transparency and flatness and has high solvent resistance, particularly high alkaline resistance and imparts high hardness to a coating to a coating film formed therefrom.

9 Claims, No Drawings

MATERIAL FOR FORMING COATING FILM

This application is a continuation of application Ser. No. 07/717,655, filed on Jun. 19, 1991, now abandoned.

This invention relates to a material for forming a coating film, and particularly to a material for forming a coating film which is suitable as a part of liquid crystal display device, charge coupled device or the like which requires transparency and heat resistance, solvent resistance or the like.

Liquid crystal display devices and charge coupled devices are formed by laminating to a glass plate or a silicone wafer an electric wiring for driving, a switching device, a color separation filter, a photodiode and the like. In such devices, an organic coating layer which is called an organic intermediate layer, undercoat layer or overcoat layer (said organic coating layer is hereinafter referred to as the protective film) is formed for electric insulation, for flattening, or for preventing the devices from being physically broken by external factors.

As a material for forming the protective film, there have heretofore been used an epoxy resin and a polyfunctional acrylate oligomer composition.

The protective film to be used in the above-mentioned display device and charge coupled device is required to be excellent in not only transparency but also surface hardness, heat resistance, flattening and solvent resistance. However, coating films formed from an epoxy resin, which contains bisphenol A unit or a polyfunctional acrylate oligomer composition do not have enough surface hardness or sufficient heat resistance, and hence, are not satisfactory.

In order to solve these problems, a material for forming a coating film consisting of a polyglycidyl methacrylate and an aromatic polycarboxylic acid has been developed (see Japanese Patent Application Kokai No. 60-217,230). However, the film obtained from this material has been still unsatisfactory in solvent resistance, particularly resistance to aqueous alkaline solution of high concentration.

The present inventors have found that the above problems can be solved by using a composition having a specific structure.

According to this invention, there is provided a thermosetting material for forming a coating film, which comprises a compound having at least one glycidyl group in the molecule (referred to hereinafter as Compound A), a compound having a substituent capable of reacting with the glycidyl group (referred to hereinafter as Compound B), and a compound having a heterocyclic structure containing secondary nitrogen atom and/or tertiary nitrogen atom (referred to hereinafter as Compound C).

Compound A is a compound having at least one glycidyl group in the molecule, and becomes a film-forming component when a coating film is formed.

Compound A can be roughly classified into a compound having a glycidyl group as a polymer side chain substituent, for example, polyglycidyl methacrylate or the like, and a compound having a glycidyl group as a terminal, for example, a polycondensate of bisphenol A and diglycidyl ether or the like. In view of coating property of the material onto the under layer, however, the compound having a glycidyl group as a polymer side chain substituent is preferred. Examples of such a compound can be represented by the following formula (I):

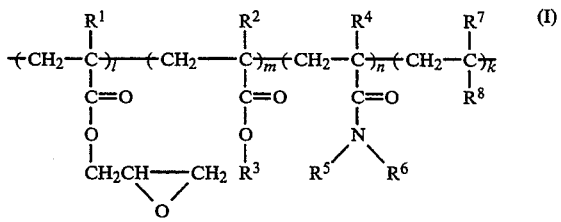

wherein $R^1$, $R^2$, $R^4$ and $R^7$ represent independently hydrogen atoms or methyl groups; $R^3$, $R^5$, and $R^6$ represent independently hydrogen atoms, alkyl groups having 1–12 carbon atoms such as methyl, ethyl and the like, or aromatic groups such as phenyl, naphthyl and the like; $R^8$ represents a phenyl group or a pyrrolidonyl group; l is an integer of 1 or more; and m, n, and k are independently 0 or integers of 1 or more.

Specific examples of the compound represented by formula (I) include polyglycidyl acrylate, polyglycidyl methacrylate, copoly (glycidyl methacrylate-methyl methacrylate), copoly(glycidyl methacrylate-tert.-butyl methacrylate), copoly(glycidyl methacrylate-styrene), copoly(glycidyl methacrylate-styrene-tert.-butyl methacrylate), copoly(glycidyl methacrylate-N,N-dimethylacrylamide) and the like.

The compound represented by formula (I) can be synthesized by homopolymerization of glycidyl acrylate or glycidyl methacrylate as a monomeric component, or copolymerization of glycidyl acrylate or glycidyl methacrylate with at least one other monomer having polymerizable double bond. Examples of said other monomers include methyl methacrylate, ethyl acrylate, tert.-butyl methacrylate, styrene, N-vinylpyrrolidone, N,N-dimethylacrylamide and the like, and these may be used in combination of two or more.

The above-mentioned homopolymerization or copolymerization can be carried out by any known method such as solution polymerization, bulk polymerization, emulsion polymerization or the like. It can also be effected by a radical polymerization, anionic polymerization, cationic polymerization or the like.

When the compound represented by formula (I) obtained by copolymerization is used, it is sufficient that at least one glycidyl group is present in one molecule; however, in order to enhance the characteristics of coating film, the compound has preferably at least 20% by weight, more preferably at least 60% by weight, of the glycidyl acrylate or methacrylate unit. When the proportion of the recurring unit contained in the molecule is less than 20% by weight, the solvent resistance is, in some cases, unsatisfactory.

As Compound A, compounds represented by formula (I) may be used alone or in combination of two or more.

Compound B is a compound having a substituent capable of reacting with the glycidyl group, and is preferably a polyfunctional compound in view of thermosetting characteristic and coating characteristic of the protective film. Among the polyfunctional compounds, preferable are aromatic polycarboxylic acids, aromatic polycarboxylic anhydrides, aromatic polyhydric phenols and aromatic polyamines.

Specific examples of the above-mentioned polyfunctional compound include phthalic acid, isophthalic acid, terephthalic acid, trimellitic acid, trimesic acid, pyromellitic acid, biphenyltertacarboxylic acid, trimellitic anhydride, pyromellitic anhydride, biphenyltetracarboxylic anhydride, 2,2-bis(4'-hydroxyphenyl)propane (common name: bisphenol A), bis(4-hydroxyphenyl)sulfone (common name: bisphenol S), dihydroquinone, isocyanuric acid, p-phenylenediamine, m-phenylenediamine, 4,4'-diaminodiphenylmethane and the like. Among them, trimellitic acid or trimellitic anhydride is preferred in view of reactivity.

Compound C is a compound having a heterocyclic structure containing secondary nitrogen atom and/or tertiary nitrogen atom, and can act as a curing catalyst.

The secondary or tertiary nitrogen atom contained in Compound C is considered to have the effect that the active hydrogen of the substituent of Compound B is protonized, and in addition, the reactive sites of the glycidyl groups of Compound A are activated, whereby the reactivity between Compound B and the glycidyl group and the reactivity of the glycidyl group with a reaction product of Compound B with the glycidyl group are enhanced to increase the crosslinking density.

Preferable examples of Compound C are compounds having a heterocyclic ring such as pyrrole, imidazole, pyrozola, pyridine, pyrazine, pyrimidine, indole, indazole or benzimidazole ring. Among the compounds, imidazole derivatives are particularly preferred.

Specific examples of Compound C include 2-methylimidazole, 2-ethyl-4-methylimidazole, 2-heptadecyl imidazole, 4-methyl-2-phenylimidazole, 1-benzyl-2-methylimidazole, 2-ethyl-4-methyl-1-(2'-cyanoethyl)imidazole, 2-ethyl-4-methyl-1-[2'-(3",5"-diaminotriazinyl)ethyl]imidazole, benzimidazole and the like. These compounds can be used in combination of two or more.

The amount of each of Compounds A, B and C used can be freely varied as far as the physical properties of the resulting coating film are not impaired. In general, however, Compound B is used in a proportion of 1–100 parts by weight per 100 parts by weight of Compound A, and Compound C is used in a proportion of 0.01–100 parts by weight per 100 parts by weight of Compound A. Preferably, the amounts of Compounds B and C are 1–45 parts by weight and 0.01–1 part by weight, respectively, per 100 parts by weight of Compound A. When the amounts of Compounds B and C used are less than the above ranges, the hardness of the coating film is not satisfactory, and when they are more than the above ranges, unreacted Compounds B and C remain stoichiometrically in the resulting coating film, and the solvent resistance of the resulting coating film tends to be deteriorated.

In forming a coating film from the present material, it is preferable to use a suitable solvent. The solvent may be any solvent as far as it has no remarkable reactivity with Compounds A, B and C. Also, the solvent which has been used in the synthesis of Compound A may be used as such in the formation of a coating film. Preferable examples of the solvent include alcohol in solvents, Cellosolves, carbitols, ketones, ethers, esters, aliphatic hydrocarbons, aromatic hydrocarbons, aprotic polar solvents and the like. Solvents having a solubility, boiling point, vapor pressure and the like which are suitable for forming a coating film are 2-ethoxyethyl acetate, 2-butoxyethyl acetate, 2'-ethoxy-2-ethxoyethyl acetate and the like. These solvents may be used in admixture of two or more.

The concentration of the present material in the solution can be freely adjusted so that a viscosity suitable for forming a coating film can be obtained; however, it is preferable to adjust the concentration to 5–40% by weight so that the solution viscosity becomes 10–250 cp at 25° C. When the viscosity is less than 10 cp, it is difficult in some cases to obtain a coating film having a satisfactory film thickness, and when the viscosity exceeds 250 cp, there is a tendency to cause film flaws owing to catching bubbles and other factors.

The solution of the present material in a solvent may be of a two-component system. For example, a solution of Compound A in a solvent and a solution of Compounds B and C in a solvent are prepared or a solution of Compounds A and C in a solvent and a solution of Compound B in a solvent are prepared and then they are mixed just before use.

In forming a coating film from the above solution, the solution is coated on a substrate on which a film is to be formed and subsequently heat-treated to be heat-cured.

The coating of the solution can be conducted by any coating means such as spin coater, roll coater, flexographic press, offset press or the like.

Heating for heat-curing can be conducted by means of a hot plate, a clean oven, an infrared heating system or the like.

When a clean oven is used for heat-curing, it is preferable to be conducted at 100°–200° C. for 10–120 minutes though the heating conditions may be freely selected depending upon the heating method.

The film thickness of the coating film may be freely determined depending upon the application purpose; however, it is preferable to adjust the thickness to 0.07–20 μm. When the thickness is outside this range, the coating film is in some cases inferior in physical properties, particularly flatness and surface hardness.

Also, for the purpose of improving the adhesion of the coating film to the substrate, surfactants, silane-coupling agents or the like may be co-used, and specifically fluorine-containing surfactants [for example, 1,1,2,2-tetrafluorooctyl 1,1,2,2-tetrafluoropropyl ether], a trialkoxysilane compound (for example, γ-glycidoxypropyltrimethoxysilane) can be used. These may be used alone or in combination of two or more, or may be directly applied to the substrate or mixed with the solution of the present material.

As mentioned above, the coating film obtained from the present material has a sufficient crosslinking density, and therefore, has high surface hardness and enhanced resistance to solvent, particularly aqueous alkaline solution of high concentration. The coating film has preferable characteristic as an organic coating layer to be formed in a liquid crystal display device, an organic coating layer to be formed on a charge coupled device or an organic coating layer to be formed between colored resin layers of color filters (intermediately or on the surface of the color filters). Accordingly, the present material for forming a coating film is suitable for forming the protective film on a liquid crystal device, charge coupled device and color filter.

This invention is further explained in more detail below referring to Examples, which are merely by way of illustration and not by way of limitation.

Example 1

(1) Synthesis of Compound A

With 300 parts by weight of 2-ethoxyethyl acetate was mixed 100 parts by weight of glycidyl methacrylate, and 0.5 part by weight of azobisisobutyronitrile (AIBN) was added thereto. The resulting mixture was subjected to reaction at 70° C. for 5 hours to obtain a solution containing 25% by weight of Compound A. The viscosity of this solution was 560 cp at 25° C. This solution is hereinafter referred to as Solution A.

(2) Preparation of coating solution

To 100 parts by weight of Solution A was added a solution consisting of 10 parts by weight of trimellitic anhydride as Compound B, 0.25 part by weight of 2-heptadecylimidazole as Compound C, 1 part by weight of γ-glycidoxypropyltrimethoxysilane and 100 parts by weight of diethylene glycol diemthyl ether to prepare a coating solution. This solution is hereinafter referred to as Solution B.

(3) Formation of coating film

Solution B was applied onto a glass plate (150×150 mm; 7059 glass material manufactured by Dow Corning Co.) by a spin coater so that the dry film thickness became 1 μm, and heat-cured in a clean oven at 180° C. for 2 hours to form a coating film.

(4) Evaluation of coating film

The coating film formed was evaluated according to the following test methods:

(i) cross-cut adhesion test

According to the method described in JIS (JIS K-5400 8.5.2 corss-cut tape test), the coating film adhering to the substrate was subjected to a cross-cut adhesion test. The size of each square formed on the film by cross-cutting by means of cutter knife was 1 mm×1 mm, and the number of squares was 100. Commercially available cellophane adhesive tape was supplied for the test. The squares which were peeled from the substrate with the tape were counted.

No square was peeled from the substrate and hence, the adhesion was satisfactory.

(ii) Alkaline resistance test

The cured film on the substrate was dipped in 10% by weight aqueous sodium hydroxide solution at 40° C. for 60 minutes.

After the treatment, neither peels nor cracks were observed by microscope, and in addition, change of film thickness was not found.

(iii) Pencil hardness test

According to the method described in JIS (JIS K-5400 6.14 pencil-scratching test), the surface hardness was measured using a pencil having a different hardness to find that the pencil hardness was 5H and sufficient crosslinking was caused.

(iv) Infrared absorption spectrum

The coating film was peeled from the substrate, and absorption due to carboxyl group corresponding to unreacted substituent of trimellitic anhydride was checked at about 1780 cm$^{-1}$ by an infrared spectrometer. No specific absorption due to carboxylic group was found and it was found that crosslinking reaction had proceeded completely.

The results mentioned above are shown in Table 1.

Examples 2 to 10

Compound A shown in Table 1 was synthesized in the same manner as shown in Example 1, and Compound B and C shown in Table 1 were added thereto to prepare a coating solution. Subsequently, in the same manner as shown in Example 1, formation of coating film and evaluation were effected.

The results obtained are shown in Table 1.

Comparative Examples 1 to 3

The same procedure as shown in Example 1 was repeated, except that Compound B or C was not used to form a coating film, and the coating film was evaluated in the same manner as shown in Example 1, to obtain the results shown in Table 1.

TABLE 1

| | Compound A | | Compound B | | Compound C | |
|---|---|---|---|---|---|---|
| | Kind | Amount (part*) | Kind | Amount (part*) | Kind | Amount (part*) |
| Example | | | | | | |
| 1 | Polyglycidyl methacrylate | 25 | Trimellitic anhydride | 10 | 2-Heptadecyl imidazole | 0.25 |
| 2 | Polyglycidyl methacrylate | 25 | Trimellitic anhydride | 4 | 2-Phenyl-4-methylimidazole | 0.05 |
| 3 | Polyglycidyl methacrylate | 25 | Trimellitic acid | 2.5 | 2-Phenyl-4-methylimidazole | 0.05 |
| 4 | Polyglycidyl methacrylate | 25 | Bisphenol A | 10 | 1-Benzyl-2-methylimidazole | 0.25 |
| 5 | Copoly[glycidyl methacrylate(62.5)-t.-butyl acrylate (37.5)] | 25 | Trimellitic anhydride | 5 | 2-Heptadecyl-imidazole | 0.25 |
| 6 | Copoly[glycidyl methacrylat(62.5)-t.-butyl acrylate (37.5)] | 25 | Trimellitic anhydride | 5 | 2-Phenyl-4-me thylimidazole | 0.05 |
| 7 | Copoly[glycidyl methacrylate(62.5)-t.butyl acrylate (37.5)] | 25 | Trimellitic acid / Trimellitic anhydride | 5 / 5 | 2-Phenyl-4-methylimidazole | 0.05 |
| 8 | Copoly[glycidyl methacrylate(80)-styrene(20)] | 25 | Trimellitic anhydride | 10 | 2-Phenyl-4-methylimidazole | 0.05 |
| 9 | Copoly[glycidyl methacrylate(67.5)-styrene(7.5)-t.-butyl methacrylate(25)] | 25 | Trimellitic anhydride | 10 | Benzoyl-imidazole | 0.25 |
| 10 | Copoly[glycidyl methacrylate(67.5)-styrene (7.5)-t.-butyl methacrylate(25)] | 25 | Trimellitic anhydride | 5 | 2-Heptadecyl-imidazole | 0.25 |
| Comp. Example | | | | | | |

TABLE 1-continued

| | | | | | | |
|---|---|---|---|---|---|---|
| 1 | Polyglycidyl methacrylate | 25 | Trimellitic anhydride | 10 | None | — |
| 2 | Polyglycidyl methacrylate | 25 | None | — | 2-heptadecyl-imidazole | 0.25 |
| 3 | Polyglycidyl methacrylate | 25 | Trimellitic acid | 0.75 | None | — |

| | Additive | | Cellophane tape peeling test | Alkaline resistance test | Pencil hardness | Infrared absorption spectrum |
|---|---|---|---|---|---|---|
| | Kind | Amount (part*) | | | | |
| Example | | | | | | |
| 1 | γ-Glycidoxy-propyltrimethoxysilane | 3 | Nothing peeled | Good | 5H | No absorption |
| 2 | γ-Glycidoxy-propyltrimethoxysilane | 3 | Nothing peeled | Good | 6H | No absorption |
| 3 | γ-Glycidoxy-propyltrimethoxysilane | 3 | Nothing peeled | Good | 4H | Unmeasured |
| 4 | γ-Glycidoxy-propyltrimethoxysilane | 3 | Nothing peeled | Good | 4H | Unmeasured |
| 5 | γ-Glycidoxy-propyltrimethoxysilane | 3 | Nothing peeled | Good | 6H | Unmeasured |
| 6 | γ-Glycidoxy-propyltrimethoxysilane | 3 | Nothing peeled | Good | 6H | No absorption |
| 7 | γ-Glycidoxy-propyltrimethoxysilane | 3 | Nothing peeled | Good | 4H | Unmeasured |
| 8 | γ-Glycidoxy-propyltrimethoxysilane | 3 | Nothing peeled | Good | 5H | No absorption |
| 9 | γ-Glycidoxy-propyltrimethoxysilane | 3 | Nothing peeled | Good | 5H | Unmeasured |
| 10 | γ-Glycidoxy-propyltrimethoxysilane | 3 | Nothing peeled | Good | 5H | Unmeasured |
| Comp. Example | | | | | | |
| 1 | γ-Glycidoxy-propyltrimethoxysilane | 3 | Nothing peeled | Crack formed, film swollen | 4H | Absorption due to carboxylic acid (a.1780 cm$^{-1}$) |
| 2 | γ-Glycidoxy-propyltrimethoxysilane | 3 | Nothing peeled | Film swollen | 2B | Unmeasured |
| 3 | γ-Glycidoxy-propyltrimethoxysilane | 3 | Nothing peeled | Film swollen | 2H | Absorption due to carboxylic acid (a.1780 cm$^{-1}$) |

Note: *: by weight

What is claimed is:

1. A material for forming a coating film, which comprises (A) at least one compound represented by formula (I):

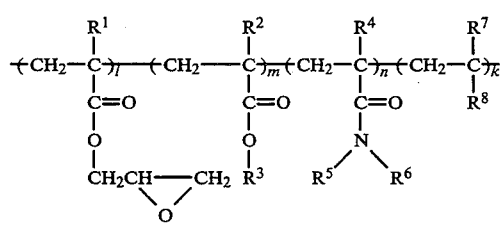

wherein $R^1$, $R^2$, $R^4$ and $R^7$ represent independently hydrogen atoms or methyl groups; $R^3$, $R^5$ and $R^6$ represent independently hydrogen atoms, alkyl groups having 1-12 carbon atoms, or aromatic groups, $R^8$ represents a phenyl group or a pyrrolidonyl group, l is an integer of 1 or more; and m, n, and k are independently 0 or integers of 1 or more, said compound of the formula (I) having at least 60% by weight of the glycidyl acrylate or glycidyl methacrylate unit, (B) a polyfunctional compound, and (C) an imidazole.

2. The material for forming a coating film according to claim 1, wherein the compound of formula (I) is selected from the group consisting of polyglycidyl acrylate, polyglycidyl methacrylate, copoly(glycidyl methacrylate-methyl methacrylate), copoly(glycidyl methacrylate-tert.-butyl methacrylate), copoly (glycidyl methacrylate-styrene), copoly (glycidyl methacrylate-styrene-tert.-butyl methacrylate), and copoly(glycidyl methacrylte-N,N-dimethylacrylamide).

3. The material for forming a coating film according to claim 1, wherein the polyfunctional compound is at least one member selected from the group consisting of aromatic polycarboxylic acids, aromatic polycarboxylic anhydrides, aromatic polyhydric phenols and aromatic polyamines.

4. The material for forming a coating film according to claim 1, wherein the polyfunctional compound (B) is selected from the group consisting of phthalic acid, isophthalic acid, terephthalic acid, trimellitic acid, trimesic acid, pyromellitic acid, biphenyltetracarboxylic acid, trimellitic anhydride, pyromellitic anhydride, biphenyltetracarboxylic anhydride, 2,2-bis-(4'-hydroxyphenyl)propane, bis(4-hydroxyphenyl)sulfone, dihydroquinone, isocyanuric acid, p-phenylene diamine, m-phenylenediamine and 4,4-diaminodiphenylmethane.

5. The material for forming a coating film according to claim 1, wherein the polyfunctional compound (B) is trimellitic acid or trimellitic anhydride.

6. The material for forming a coating film according to claim 1, wherein the proportion of the polyfunctional compound (B) is 1–100 parts by weight per 100 parts by weight of the compound (A) represented by formula (I) and the proportion of the imidazole (C) is 0.01–10 part by weight per 100 part by weight of the compound (A) represented by formula (I).

7. The material for forming a coating film according to claim 1, wherein the proportion of the polyfunctional compound (B) is 1–45 parts by weight per 100 parts by weight of the compound (A) represented by formula (I) and the proportion of the imidazole (C) is 0.01–1 part by weight per 100 parts by weight of the compound (A) represented by formula (I).

8. The material for forming a coating film according to claim 1, wherein the imidazole (C) is selected from the group consisting of 2-methylimidazole, 2-ethyl-4-methylimidazole, 2-heptadecylimidazole, 4-methyl-2-phenylimidazole, 1-benzyl-2-methylimidazole, 2-ethyl-4-methyl-1-(2'-cyanoethyl)imidazole and 2-ethyl-4-methyl-1-[2'-(3'',5''-diaminotriazinyl)ethyl]imidazole.

9. The material for forming a coating film according to claim 1, wherein said polyfunctional compounds reactive with a glycidyl group is selected from the group consisting of carboxylic acids, carboxylic anhydrides, amines and phenols.

* * * * *